United States Patent
Sarihan et al.

(10) Patent No.: US 9,548,280 B2
(45) Date of Patent: Jan. 17, 2017

(54) SOLDER PAD FOR SEMICONDUCTOR DEVICE PACKAGE

(71) Applicant: Freescale Semiconductor, Inc., Austin, TX (US)

(72) Inventors: Vijay Sarihan, Paradise Valley, AZ (US); Zhiwei Gong, Chandler, AZ (US); Scott M. Hayes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 35 days.

(21) Appl. No.: 14/243,649

(22) Filed: Apr. 2, 2014

(65) Prior Publication Data

US 2015/0287685 A1 Oct. 8, 2015

(51) Int. Cl.
*H01L 23/00* (2006.01)
*H05K 1/11* (2006.01)

(52) U.S. Cl.
CPC ........... *H01L 24/05* (2013.01); *H01L 24/03* (2013.01); *H05K 1/111* (2013.01); *H05K 1/114* (2013.01); *H01L 2224/0401* (2013.01); *H01L 2224/05017* (2013.01); *H01L 2224/05025* (2013.01); *H01L 2924/2064* (2013.01); *H01L 2924/20641* (2013.01)

(58) Field of Classification Search
CPC ........................................... H01L 2224/05017
See application file for complete search history.

(56) References Cited

U.S. PATENT DOCUMENTS

| | | | |
|---|---|---|---|
| 5,872,399 A | 2/1999 | Lee | |
| 6,201,305 B1* | 3/2001 | Darveaux | H05K 1/111 257/779 |
| 6,489,640 B1* | 12/2002 | Smith | 257/209 |
| 6,858,944 B2* | 2/2005 | Huang | H01L 24/05 257/773 |
| 6,940,179 B2 | 9/2005 | Lee | |
| 6,958,527 B2* | 10/2005 | Hanaoka | H01L 23/49816 174/255 |
| 7,514,790 B2* | 4/2009 | Shindo | 257/739 |
| 7,545,028 B2 | 6/2009 | Zhang | |
| 8,258,617 B2 | 9/2012 | Shibuya | |
| 8,294,039 B2 | 10/2012 | Yang et al. | |
| 8,466,554 B2 | 6/2013 | Park et al. | |
| 2004/0041393 A1 | 3/2004 | Lee | |
| 2005/0054187 A1* | 3/2005 | Ding et al. | 438/612 |
| 2006/0084254 A1* | 4/2006 | Attarwala | 438/584 |
| 2008/0093749 A1* | 4/2008 | Gerber et al. | 257/784 |
| 2014/0252610 A1* | 9/2014 | Chen | H01L 23/562 257/738 |

* cited by examiner

Primary Examiner — Erik Kielin

(57) ABSTRACT

A solder ball pad for mounting a solder ball of a semiconductor device for preventing delamination of an overlying dielectric layer, and particularly devices and methods providing improved solder ball pad structures in a device such as a semiconductor device package.

15 Claims, 10 Drawing Sheets

SOLDER PAD FOR SEMICONDUCTOR DEVICE PACKAGE

FIELD OF THE INVENTION

The present invention relates generally to semiconductor devices, and more particularly to a solder ball pad, for example, on a semiconductor device package such as redistributed chip package (RCP), having interconnected components, and methods for forming the solder ball pad, devices and packages.

BACKGROUND OF THE INVENTION

In semiconductor processing, processing techniques can be used to decrease package size of semiconductor devices. Generally in package processing, semiconductor dies are placed active surface side down on an adhesive material situated on a process carrier substrate, and encapsulated with a molding material, which is then cured. The molding material can be any appropriate encapsulant, for example, a silica-filled epoxy molding compound, a plastic encapsulation resin, or other polymeric material such as silicones, polyimides, phenolics and polyurethanes. The encapsulated die panel is then separated from the adhesive material and process carrier substrate and cleaned to remove any remaining adhesive. Additional processing can then be conducted on the exposed surface of the dies to build-up a multi-layer circuit interconnect. An interconnect is generally composed of alternating layers of an insulating or dielectric material and metal (e.g., traces, interconnects, etc.). The interconnect is typically formed using photolithography and plating techniques. Solder balls can be formed or dropped on solder ball pads formed in a final metallization layer, for making electrical connections to a PCB. The dies can then be singulated by cutting through designated areas to form single or multiple semiconductor device packages.

Solder ball pads are formed on a semiconductor die to provide means for transferring electrical signals and power to and from circuitry of the semiconductor die through solder balls, conductive bumps, etc. In a multilayered circuit interconnect, an insulative layer or solder mask (also called a passivation layer) is formed over the final metallization layer that has been laminated or formed on an insulating layer. The final metallization layer typically includes solder ball pads, circuit traces, through-hole vias, etc. An opening is formed in the solder mask to expose a portion of the solder ball pad and a solder ball may be attached or formed on the exposed pad area. In semiconductor processing, it is important to have a good connection and adhesion of metal layers and insulating layers to prevent cracking of the insulating layers which can reduce package integrity and reliability and lead to chip failure.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of the invention generally include semiconductor devices, packaged devices, and methods for forming the devices and packages. The devices are structured with an improved solder ball pad for mounting a solder ball, for example, on a semiconductor device package (e.g., a redistributed chip packaging (RCP) device package), which prevents delamination of an overlying dielectric layer (e.g., solder mask) from the solder ball pad. Such delamination can be caused, for example, by processing involving thermal cycling and by mechanical forces on the attached solder ball.

Delamination of a dielectric layer (e.g., solder mask) from the solder ball pad can occur along the peripheral edge of the solder ball pad. Edge-induced delamination of the overlying dielectric layer typically commences as a relatively small flaw in the attachment of the dielectric layer at a point along the peripheral edge of the ball pad and can spread and continue to detach the dielectric layer about the perimeter of the ball pad. Delamination can also occur along the interface of the dielectric layer with the horizontal surface of the solder ball pad.

Figure 1:
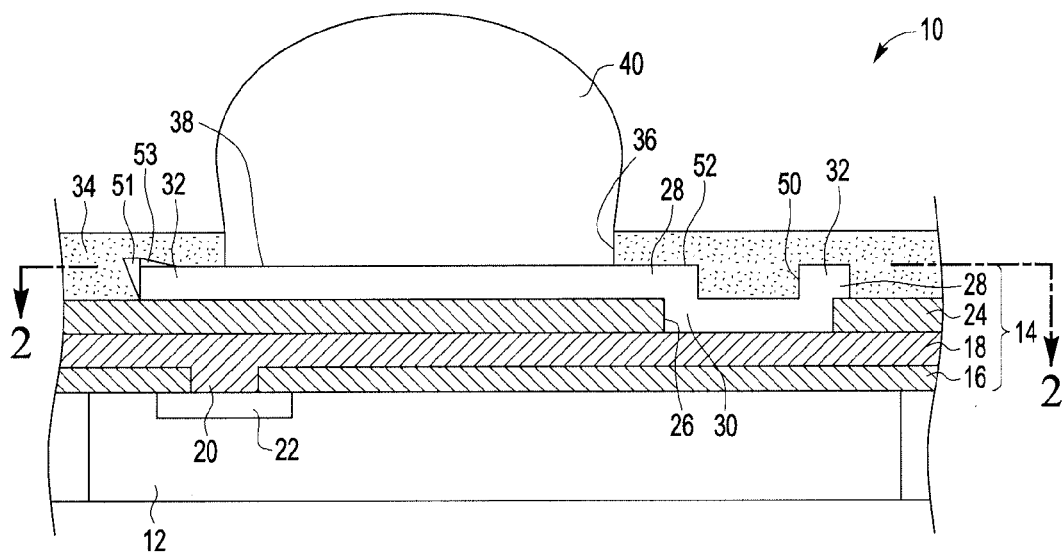
FIG. 1 is a cross-sectional, elevational view of a portion of a semiconductor device package with a conventional solder ball pad, illustrating delamination of a solder mask from the solder ball pad.

Edge- or surface-induced delamination of the overlying dielectric layer (e.g., solder mask) can result in observable vertical or horizontal cracking in the overlying dielectric layer, an underlying dielectric (insulating) layer, or both. If delamination of the overlying dielectric layer from the solder ball pad reaches a critical level, lateral and horizontal cracks can occur in the overlying dielectric layer or an underlying dielectric (insulating) layer. Such cracking in the dielectric layer(s) can lead to eventual device failure due, for example, to moisture absorption and contamination. FIG. 1 depicts a cross-sectional, elevational view of a portion of a standard semiconductor device package 10 and illustrates the problem of delamination of an overlying dielectric layer (e.g. solder mask) from a conventional solder ball pad 32.

Figure 2:
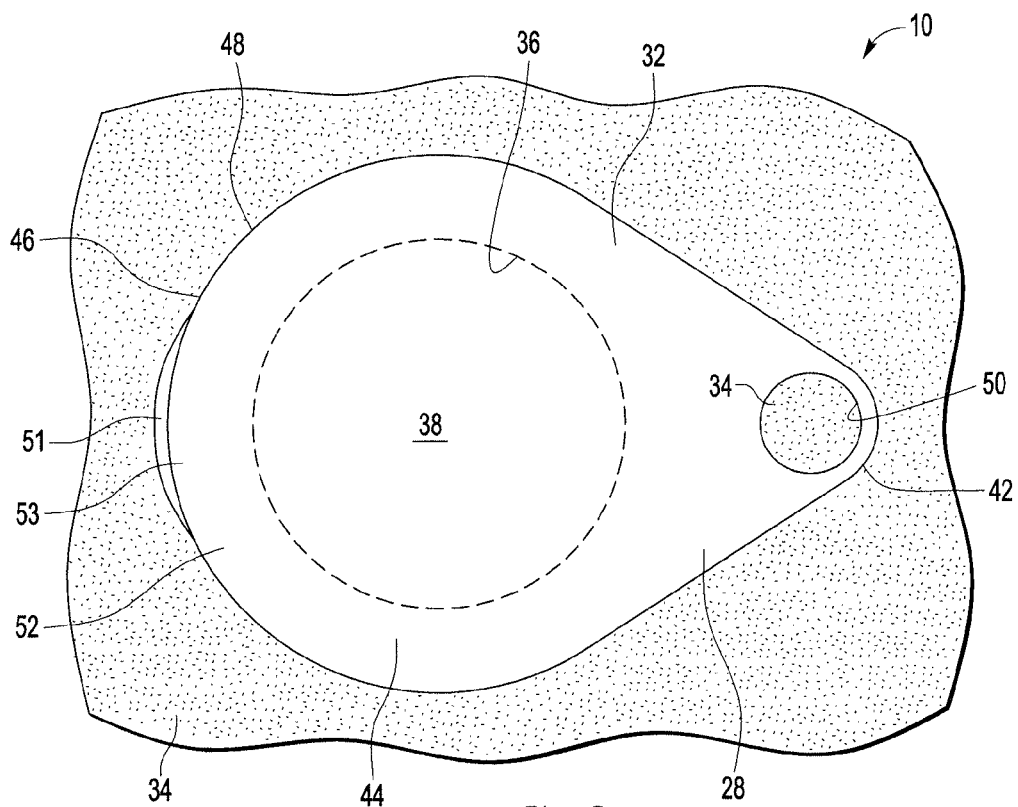
FIG. 2 is a plan view of the semiconductor device package of FIG. 1, taken along lines 2-2, showing the delamination of the solder mask along the edge of the conventional solder ball pad.

Semiconductor device package 10 includes an encapsulated die 12 and a multi-layer circuit interconnect 14. The interconnect 14 is composed of a patterned insulating layer 16 over the active surface of the die 12, and a patterned conductive layer 18 with a conductive contact 20 to an active area 22 on the die 12. A patterned overlying insulating (dielectric) layer 24 includes an opening 26 to the conductive layer 18. A final metallization layer 28 formed on the insulating layer 24, includes a conventional solder ball pad 32, such as that used in an RCP device package. A dielectric layer (e.g., solder mask) 34 is formed over the solder ball pad 32 and the insulating layer 24. The dielectric layer 34 is patterned to form an opening 36 to expose a mounting area 38 on the solder ball pad 32. A solder ball 40 is then dropped or formed on the mounting area 38. As shown in FIG. 2, the solder ball pad 32 has a tapered end 42, a central pad portion 44, a peripheral edge 46 about the perimeter 48, and a cavity or recessed portion 50. The dielectric layer 34 overlaps the peripheral edge 46 of the solder ball pad 32.

FIGS. 1-2 illustrate edge-induced delamination of the dielectric layer 34 from the peripheral edge 46 of a conventional solder ball pad 32 at area 51 during processing. FIGS. 1-2 also illustrate the delamination or lift-off of the dielectric layer 34 from the surface 52 of the solder ball pad 32 along the horizontal interface at area 53. As a result of such delamination, lateral and horizontal cracks can occur in the overlying portion of the dielectric layer 34, the underlying insulating (dielectric) layer 24, or both.

The present invention provides solder ball pads having one or more features configured to lock the solder ball pad to an overlying dielectric layer. Such features of the inventive solder ball pads overcome problems of edge-induced and surface-induced delamination of an overlying dielectric layer (e.g., solder mask).

Figure 3:
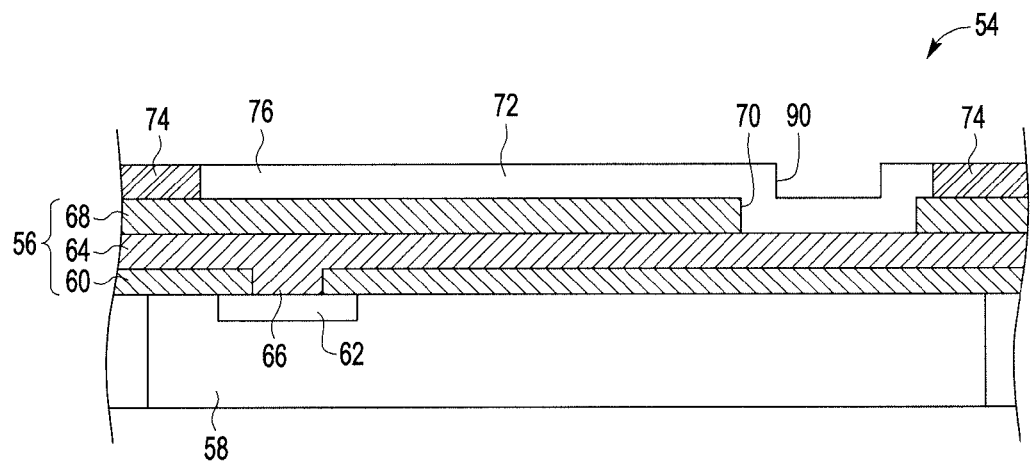
FIG. 3 is a cross-sectional, elevational view of a semiconductor device package with a build-up of a multi-layer circuit interconnect in progress, showing a solder ball pad according to the invention.

Referring to FIG. 3, a cross-sectional view of a standard semiconductor device package 54 is illustrated at a stage in the build-up of a multi-layer circuit interconnect 56 on an encapsulated semiconductor die 58. Typically, as depicted, a dielectric (insulating) layer 60 is formed over the exposed surface of the encapsulated die 58 and patterned/etched to form opening(s) to expose traces, contacts or other active area 62 on the die. A conductive layer 64 is then formed over the dielectric (insulating) layer 60 and into the opening to form a contact 66 and traces and other electrical contacts or interconnects. An overlying dielectric (insulating) layer 68 is formed over the conductive layer 64, and patterned/etched to provide via holes and openings 70 to the conductive layer 64. This can be followed by another conductive layer, another insulating layer, and so forth, with the number of insulating and conductive layers in the build-up determined by package requirements and size. Via holes and openings can be formed by patterning and etching an insulating layer, and then filled with a conductive material to form conductive contacts (e.g., vias) to interconnect contacts and traces in the overlying and underlying conductive layers.

In general, the dielectric (insulating) layers can be formed as an insulative polymer such as a silicone gel or elastomer, polyurethane, epoxy, polysiloxanes, acrylic and the like, or other materials used for interlayer dielectrics known in the art such as silicon dioxide, silicon nitride and silicon oxynitride, to provide electrical isolation, by any appropriate processing technique. In embodiments, the dielectric (insulating) layers are formed from a spin-coated photoimageable dielectric, and patterned and etched by a lithographic technique to expose active areas, traces and contacts.

Conductive layers can be formed as metal, metal alloy, doped semiconductor, semi-metals, or combinations thereof (e.g., copper, aluminum, gold, silver, nickel, tin, platinum, tantalum, titanium, tungsten, amorphous silicon, doped polysilicon). The conductive layers can be formed by any appropriate processing technique (e.g., lamination, electroplating) as a single layer or a multilayer combination of metals. In embodiments, a conductive metal layer such as copper can be deposited as an initial layer onto dielectric (insulating) layer (e.g., by physical vapor deposition (PVD) or sputtering), and then built up by an electroplating technique. In embodiments, the conductive layer is patterned to define interconnects and other electrical contacts or pathways (e.g., traces, vias).

Figure 4:
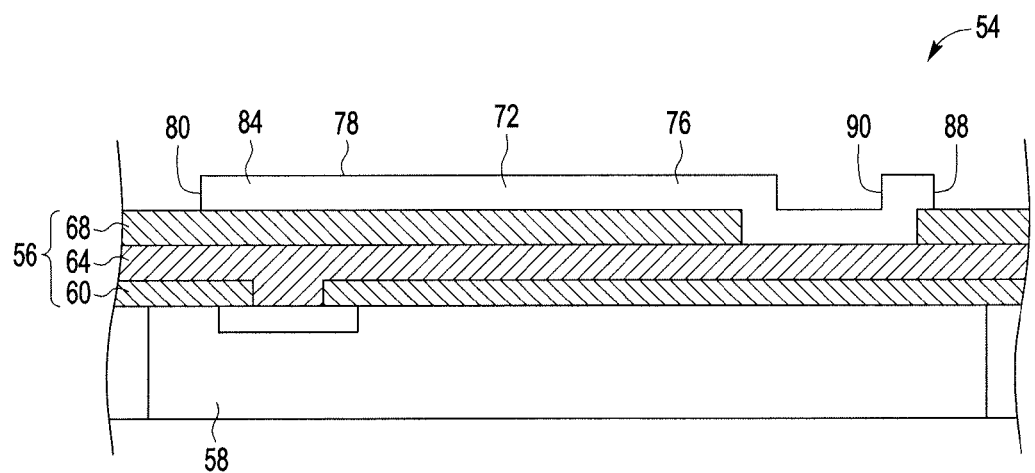
FIG. 4 is a cross-sectional, elevational view of the semiconductor device package of FIG. 3 at a subsequent process step.
Figure 5:
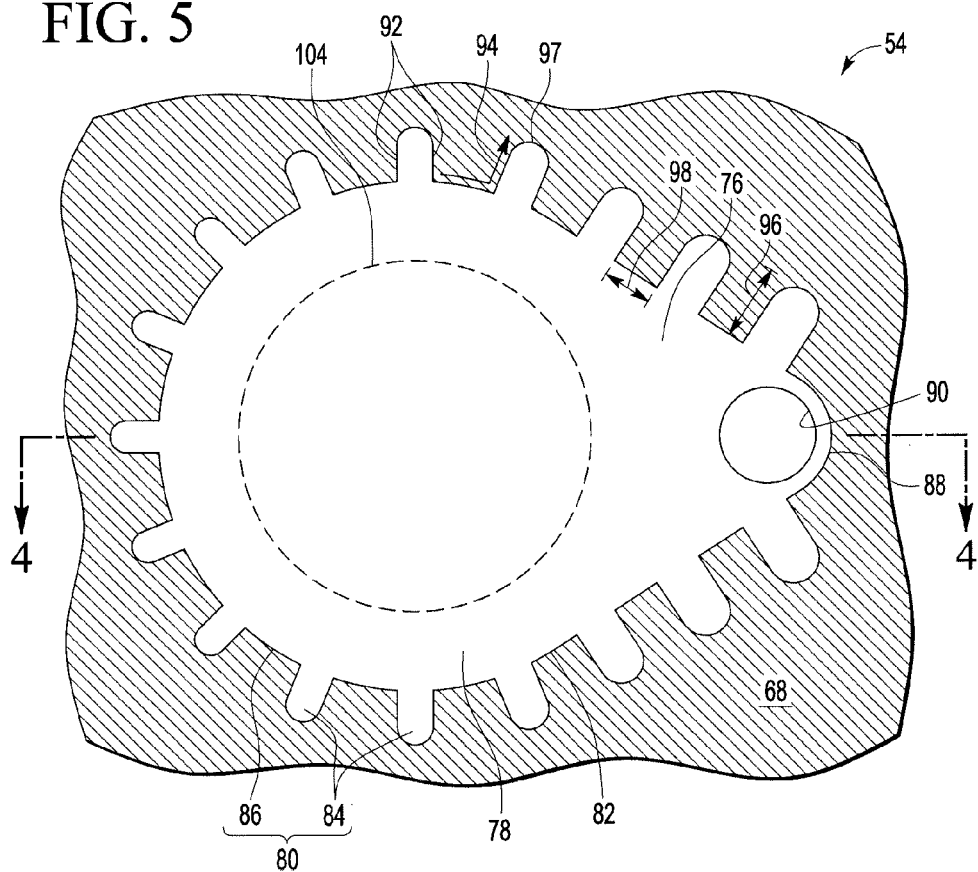
FIG. 5 is a plan view of the semiconductor device package of FIG. 4, showing the solder ball pad.

As illustrated in FIGS. 4-5, a final metallization layer 72 is formed on the dielectric (insulating) layer 68 to define a solder ball pad 76 according to the invention having one or more features configured to lock the solder ball pad to an overlying dielectric layer to inhibit or prevent delamination of the dielectric layer from the solder ball pad. As shown, the solder ball pad 76 is shaped with a tapered end 88, although the pad can have other shapes (e.g., square, round, oval). The final metallization layer 72 (e.g., copper, aluminum, gold, silver, nickel, tin, platinum) can be formed, for example, by lamination or plating, on the insulating layer 68. The metallization layer 72 is then patterned using photolithography techniques to define the solder ball pad 76 having a central pad portion 78, a peripheral edge 80 about the perimeter 82 and the locking features of the pad.

For example, in an embodiment, an initial metal seed layer (not shown) can be formed over the dielectric (insulating) layer 68 and within the opening 70 over the conductive layer 64 by a sputtering technique. An overlying photoresist layer 74 can then be formed and patterned to define the desired metal features on the seed layer (e.g., traces, interconnects, vias) including the solder ball pad 76 and the locking features of the pad. The seed layer can then be built-up to the desired thickness using an electroplating technique. The photoresist layer 74 and underlying seed layer (not shown) can then be removed.

As illustrated in FIG. 5, the peripheral edge 80 of the pad 76 is patterned with locking features in the form of one or more outwardly extending protrusions 84 along at least a part of the perimeter 82. In an embodiment, the protrusions 84 can be provided continuously about the perimeter 82 of the solder ball pad. In embodiments, the peripheral edge 80 can be structured with multiple protrusions 84 having the same or different shapes and with sides 92 at the same or different angles.

The one or more protrusions 84 of the solder ball pad 76 provide a greater contact area between the peripheral edge 80 of the ball pad and the overlying dielectric layer (e.g., solder mask) 100. Such contact enhances adhesion and inhibits the overlying dielectric layer from pulling away from the peripheral edge of the ball pad due to thermal-mechanical forces acting on a solder ball 106 attached to the pad 76. The one or more protrusions 84 of the solder ball pad 76 along the peripheral edge provide an effective obstacle to deflect and cause a change in direction of the edge delamination of the solder mask from along the peripheral edge 80 of the solder ball pad to along a protrusion 84, as depicted by arrow 94 in FIG. 5. The protrusions 84 are spaced apart and configured with a shape and length 96 to effect such a deflection to reduce the momentum of an edge-induced delamination of the overlying dielectric layer and contain the delamination to a relatively short distance along the perimeter. For example, the protrusions 84 can be spaced apart and sized with a length effective to confine the edge-induced delamination to a section of the peripheral edge 80 between two adjacent protrusions 84. By another example, a single protrusion 84 can be sized with a length 96 effective to limit the delamination to along a side 92 and to or prior to the distal end 97 of the protrusion. By limiting the extent of the delamination, cracking in the overlying dielectric layer (e.g., solder mask) and an underlying dielectric (insulating) layer is substantially reduced or eliminated.

For example, the peripheral edge 80 of the solder ball pad 76 can be designed with two or more spaced apart and outwardly extending protrusions 84 with a relatively straight edge section 86 between adjacent protrusions, as depicted in FIG. 5, for example. In other embodiments, the plurality of protrusions 84 can be spaced apart by a curved edge section 86 therebetween, for example, as shown in a partial view in FIG. 6. By example, the distance (spacing) 98 between adjacent protrusions 84 along the peripheral edge 80 can be about 20-100 µm, more typically about 50-75 µm.

In general, the length 96 of the protrusions 84 can be about 10-100 µm, more typically about 35-50 µm. In embodiments, the length 96 of the protrusions 84 is effective to contain an edge-induced delamination of an overlying dielectric layer along one side 92 and prior to the distal end 97 of the protrusion. The length 96 of the protrusions 84 of the pad design is generally driven by x-y spatial constraints based upon the area available on the dielectric layer 68 for the layout of the solder ball pad within the confines of the package. The length 96 of the protrusions 84 can also be influenced by the thickness of the pad 76. In general, thinner pads can allow a shorter length for the protrusions. By example, for a relatively thin pad 76 (e.g., a thickness of less than 10 µm, for example, a thickness of about 2 to less than 10 µm), the length 96 of the protrusions 84 can be up to about 75 µm, for example, about 10-75 µm, or about 25-50 µm. For a relatively thick pad 76 (e.g., a thickness of about 10 µm or more, for example, a thickness of about 10-20 µm), the length 96 of the protrusions 84 can be up to about 100 µm, for example, about 25-100 µm, or about 75-100 µm.

Figure 7:
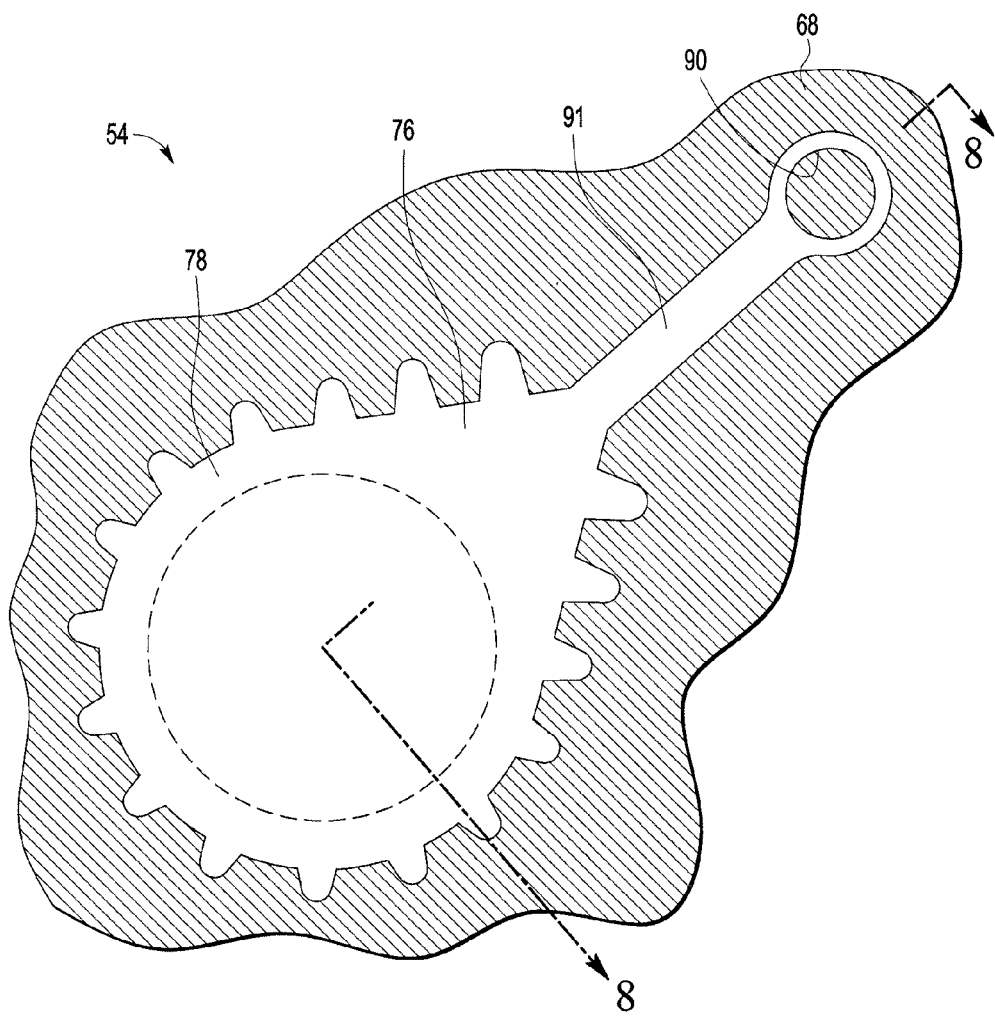
FIG. 7 is a plan view of an embodiment of a semiconductor device package showing a solder ball pad according to the invention.
Figure 8:
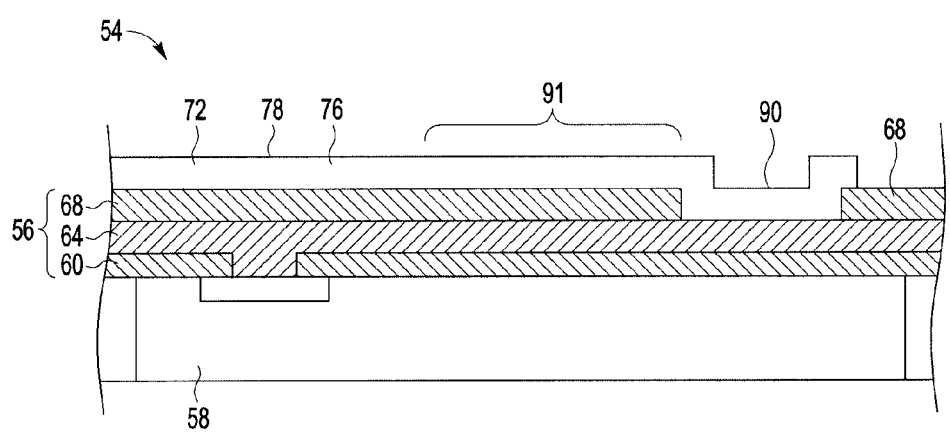
FIG. 8 is a partial, cross-sectional, elevational view of the semiconductor device package of FIG. 7, taken along lines 8-8.

In embodiments, the solder ball pad 76 is patterned to include a cavity or recessed portion 90 adjacent to the central pad portion 78 at one end (e.g., tapered end 88) of the pad, as shown in FIG. 5. During processing, the cavity 90 becomes filled with the overlying dielectric layer 100 and the filled cavity functions to provide increased adhesion of the pad to the overlying dielectric layer. In another embodiment, the recessed portion 90 can be positioned at a distance away from the solder ball pad 76 and connected to the pad by a metal trace 91, as illustrated in FIGS. 7-8. In embodiments, the diameter of the recessed portion 90 is about 25-200 µm, more typically about 50-150 µm.

Figure 9:
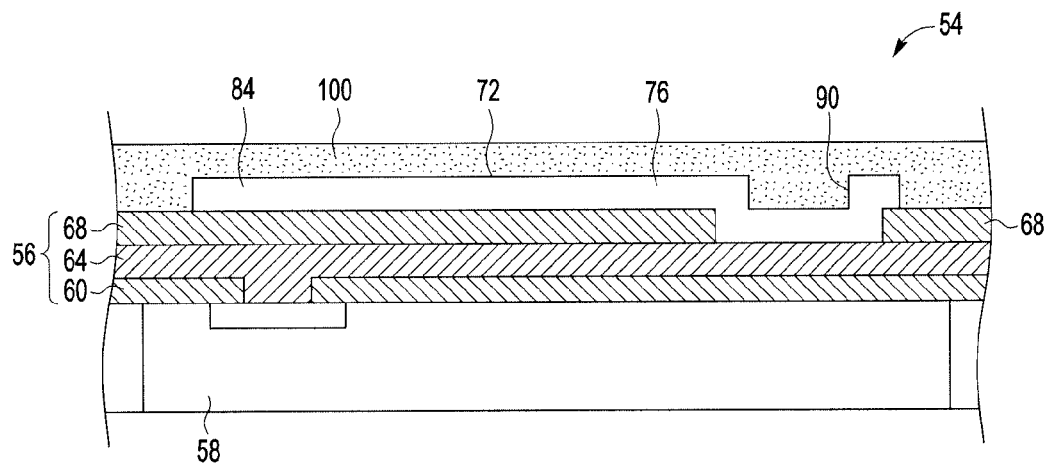
FIG. 9 is a cross-sectional, elevational view of the semiconductor device package of FIG. 4 at a subsequent process step showing a dielectric layer (e.g., solder mask) formed over the solder ball pad.
Figure 10:
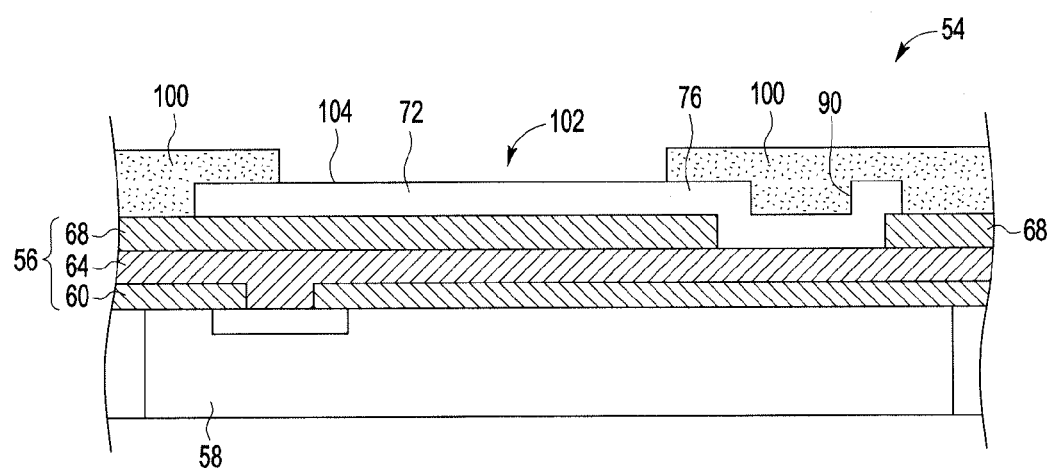
FIG. 10 is a cross-sectional, elevational view of the semiconductor device package of FIG. 9 at a subsequent process step.

Referring now to FIG. 9, a dielectric layer (e.g., solder mask) 100 can be formed over the insulating (dielectric) layer 68 and metallization layer 72, including over the solder ball pad 76. The dielectric layer 100 can be, for example, an acrylic or polyimide plastic, or an epoxy resin, which can be spin-coated over the final metallization layer. The dielectric layer 100 is then patterned to form an opening 102 to expose a solder ball mounting area 104 on the central pad portion 78 of the solder ball pad 76, as illustrated in FIG. 10. As shown, the patterned dielectric layer 100 overlaps the peripheral edge 80 including the protrusions 84 and edge sections 86, and fills the recessed portion 90.

Figure 11:
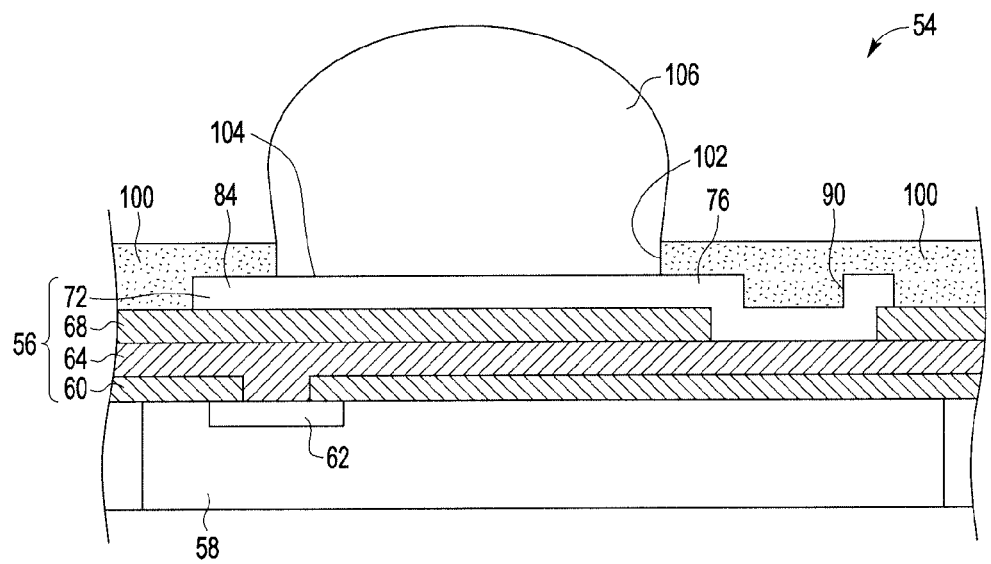
FIG. 11 is a cross-sectional, elevational view of the semiconductor device package of FIG. 10 at a subsequent process step showing a solder ball on the solder ball pad.

As illustrated in FIG. 11, in embodiments, a solder ball 106 is then dropped or formed on the exposed mounting area 104 on the solder ball pad 76 within the opening 102. The resulting semiconductor device package 54 includes traces and interconnecting conductive vias that are routed or redistributed among the layers within the build-up (multi-layer circuit interconnect 56) to form the routing (electrical interconnects) between active areas 62 (e.g., bond pads) on the active surface of the die 58 and external elements, e.g., solder balls 106. The die panel can then be cut, sawed or otherwise separated through designated areas into singulated single or multiple semiconductor device packages.

Figure 12:
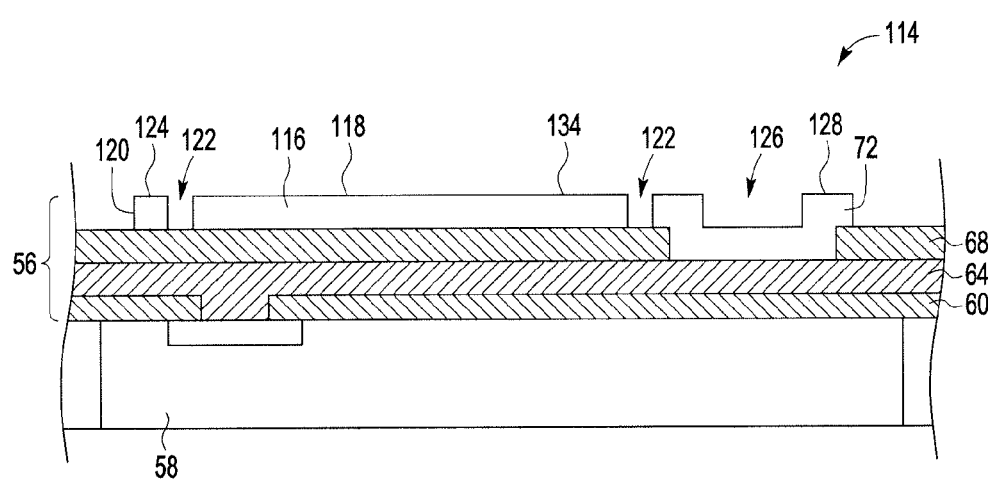
FIG. 12 is a cross-sectional, elevational view of a semiconductor device package at a stage in the build-up of a multi-layer circuit interconnect showing a solder ball pad according to the invention.
Figure 13:
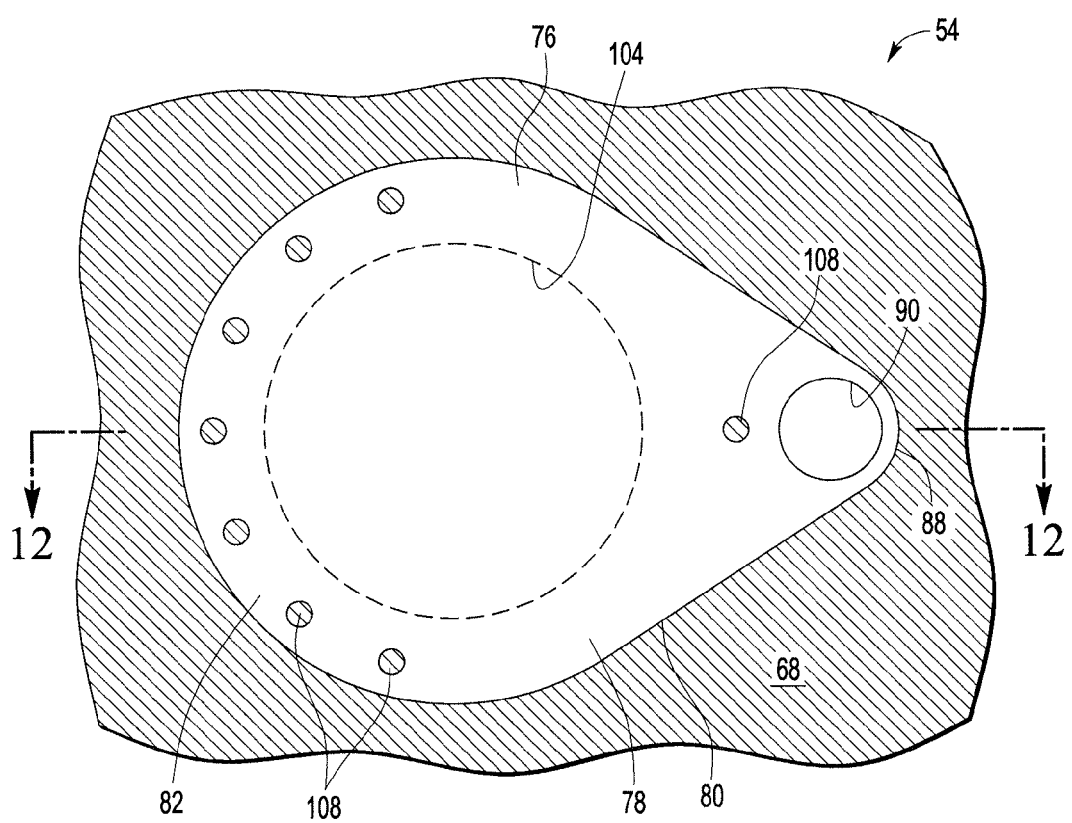
FIG. 13 is a plan view of the semiconductor device package of FIG. 12, showing the solder ball pad.
Figure 14:
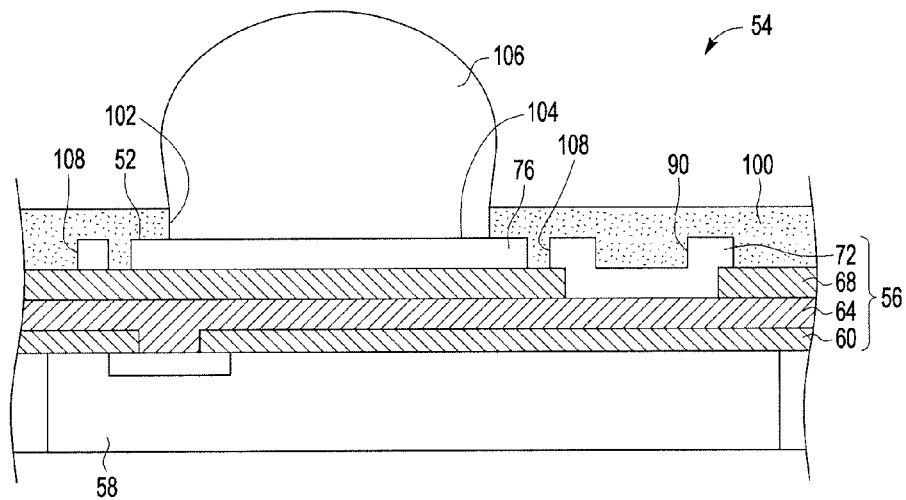
FIG. 14 is a cross-sectional, elevational view of the semiconductor device package of FIG. 13 at a subsequent process step showing a solder ball on the solder ball pad.

Referring now to FIGS. 12-13, the locking feature of the solder ball pad 76 can be in the form of at least one through-hole 108 extending through the solder ball pad. As shown in FIG. 14, the through-holes 108 are filled with dielectric layer (e.g., solder mask) 100. The fill within the through-holes 108 enhance the adhesion of the dielectric layer 100 with the underlying insulating (dielectric) layer 68 to "lock" the dielectric layer 100 to the surface 52 of the solder ball pad 76. The enhanced adhesion substantially reduces or eliminates lifting and delamination of the dielectric layer 100 along the surface 52 of the solder ball pad 76, and prevents subsequent cracking of the overlying dielectric layer 100 that can result.

The diameter and arrangement of the through-holes 108 are effective to lock the solder ball pad 76 to an overlying dielectric layer 100 (when filled with dielectric) to inhibit or prevent delamination of the dielectric layer from the solder ball pad. In general, the diameter of the through-holes 108 can be about 10-80 µm, more typically about 20-35 µm. Factors used in determining the diameter of the through-holes 108 include spatial constraints (x-y) of the pad design, and the thickness of the pad 76 and desired aspect ratio of the through-hole.

The diameter of the through-holes 108 of the pad design is generally driven by x-y spatial constraints placed on the size of the pad (x-y axis) based upon the area available on the dielectric layer 68 for the layout of the solder ball pad within the confines of the package. For example, the diameter of the through-holes can be increased as space allows.

The diameter of the through-holes 108 is also influenced by the thickness of the pad and the desired aspect ratio (i.e., pad thickness divided by the hole diameter) to allow filling of the through-hole with dielectric. By example, for a relatively thick pad 76 (e.g., a thickness of about 10 µm or more, for example, a thickness of about 10-20 µm), the diameter of the through-holes 108 can be about 20-80 µm, preferably about 20-40 µm. For a relatively thin pad 76 (e.g., a thickness of less than 10 µm, for example, a thickness of about 2 to less than 10 µm), the diameter of the through-holes 108 can be about 10-60 µm, preferably about 10-30 µm.

The through-holes 108 can be arranged along the perimeter 82, within the central pad portion 78 of the solder ball pad 76, or both. Factors that determine the number and arrangement of the through-holes on the solder ball pad include, for example, the size of the pad and the solder mask opening 104.

Figure 6:
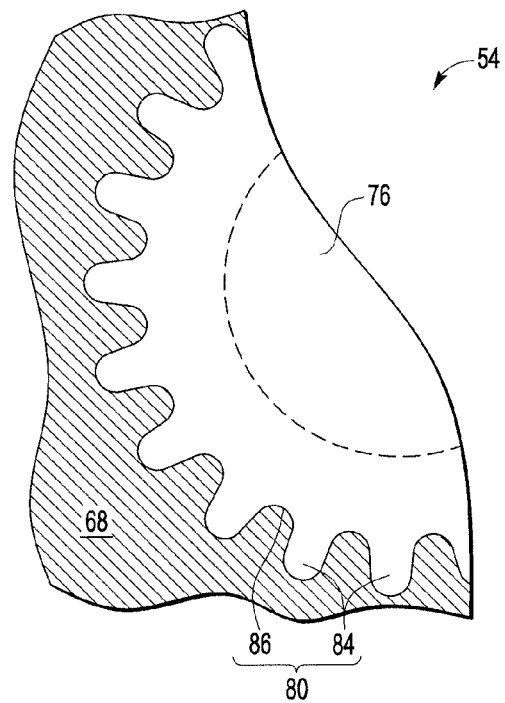
FIG. 6 is a partial plan view of the semiconductor device package of FIG. 4, showing a partial view of a solder ball pad according to the invention.
Figure 15:
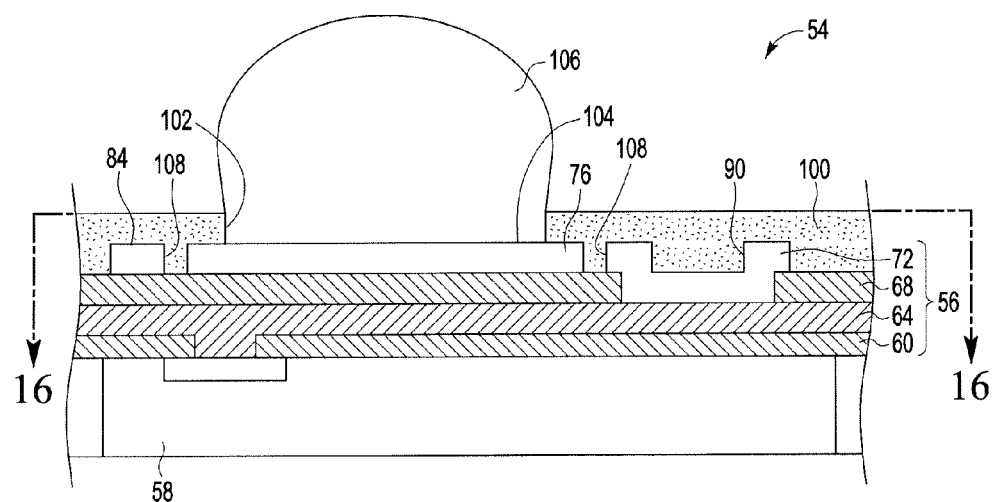
FIG. 15 is a cross-sectional, elevational view of a semiconductor device package showing a solder ball pad according to the invention.
Figure 16:
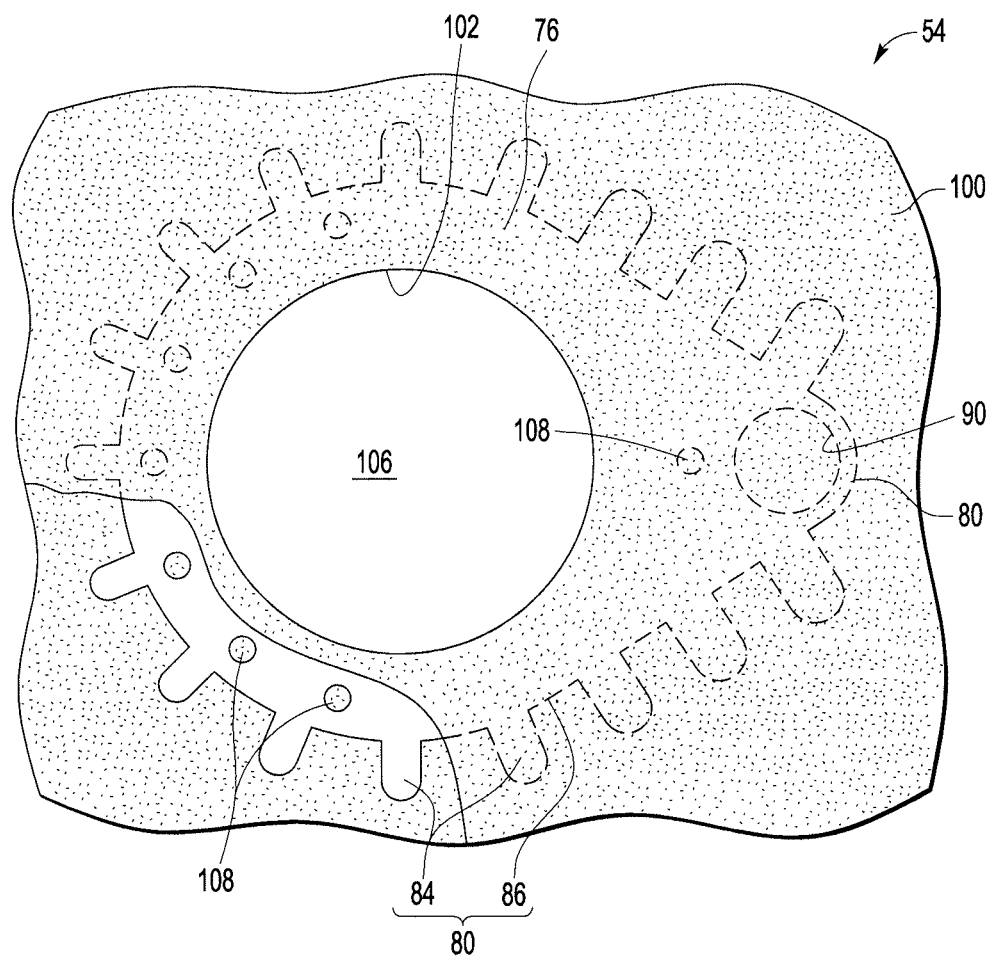
FIG. 16 is a plan view of the semiconductor device package of FIG. 15, taken along lines 16-16m showing the dielectric layer (e.g., solder mask) partially cut away to expose the solder ball pad.

As illustrated in FIGS. 15-16, the solder ball pad 76 of the invention can be structured to combine both protrusions 84 and through-holes 108 as locking features to inhibit or eliminate delamination of an overlying dielectric layer 100 from the ball pad. In embodiments, the protrusions 84 can be as shown in FIG. 6.

Figure 17:
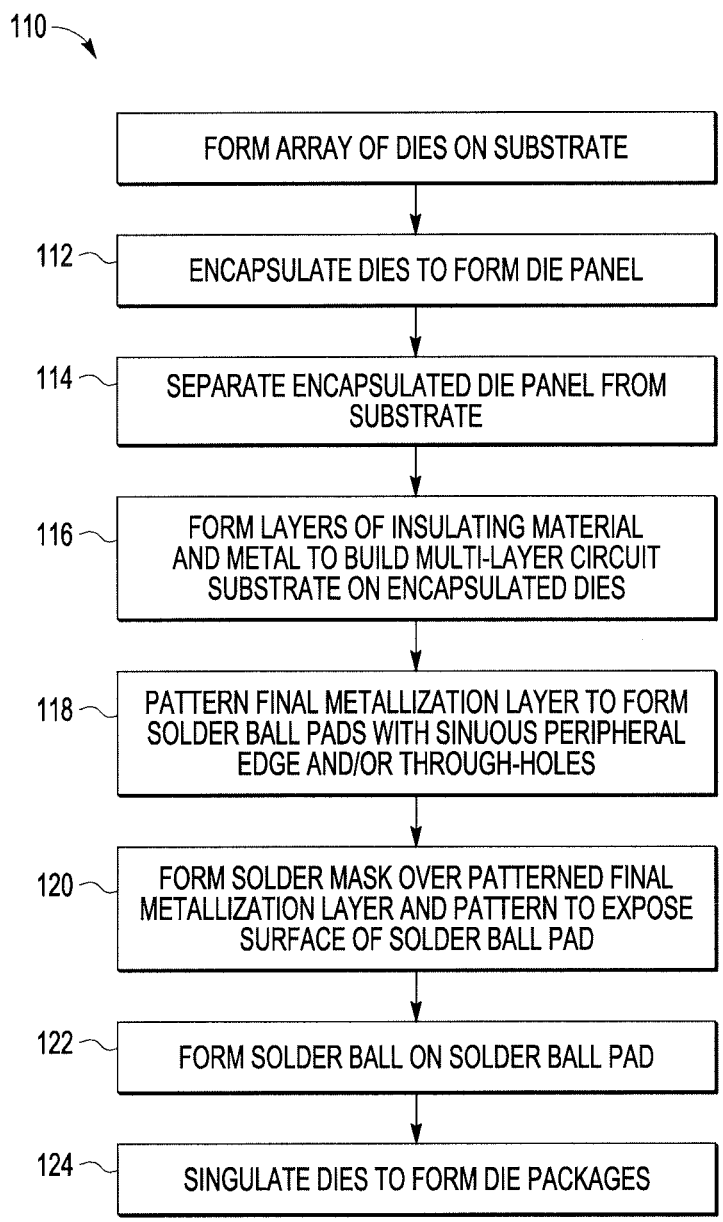
FIG. 17 is a flow chart illustrating a method of preparing a semiconductor device package according to an embodiment of the invention, given by way of example.

FIG. 17 is a flowchart illustrating a method 109 of forming a packaged semiconductor device by a chip packaging technique according to an embodiment of the invention, as an example. At 110, an array of semiconductor dies are placed on a surface of a removable attachment material (e.g., a double-sided tape, a glue layer, etc.) situated on a process carrier substrate. At 112, an encapsulation process is performed to cover the dies with a mold compound or mold encapsulant, which is then cured. At 114, the encapsulated die panel is then separated from the process carrier substrate and de-taped. At 116, additional processing is then conducted on the exposed surface of the dies to build-up a multi-layer circuit interconnect (e.g., 56) composed of alternating layers of a dielectric (insulating) material (e.g., 60, 68) and metal (e.g., 64, 72) using photolithography and plating techniques. At 118, solder ball pads (76) are formed according to the invention as part of the final metallization layer (72), for example, by photolithography and plating processes. At 120, a dielectric layer (e.g., solder mask) (100) is formed over the final metallization layer and patterned to exposed the surface of the solder ball pad. At 122, solder balls (106) are formed on the solder ball pads for making electrical connections to a PCB. At 124, the packaged dies are then singulated by cutting through designated areas of the die panel to form single or multiple semiconductor device packages.

It should be appreciated that the present invention is intended to encompass numerous embodiments. For example, in embodiments, the invention relates to a semiconductor device package, comprising a solder ball pad formed on a first dielectric layer, and a second dielectric layer formed over and around at least a portion of the solder ball pad, wherein the solder ball pad comprises a locking feature comprising one or more features configured to lock the solder ball pad to the second dielectric layer to inhibit delamination of the second dielectric layer from the solder ball pad. In embodiments, the locking feature comprises one or more outwardly extending protrusions along a perimeter of the solder ball pad. In embodiments, the one or more protrusions have opposing sides and a distal end, and the length of the protrusion is effective to limit a delamination to one side and prior to the distal end of a protrusion. In embodiments, the length of the protrusion is about 10-100 µm. In embodiments, the solder ball pad has a thickness of about 10-20 µm and the length of the protrusion is about 25-100 µm. In embodiments, the solder ball pad is relatively thinner, with a thickness of about 2-10 µm and the length of the protrusion is about 10-75 µm. In embodiments, the locking feature comprises one or more through-holes extending through the solder ball pad to the first dielectric layer. In embodiments, the locking comprises a plurality of through-holes along the perimeter of the solder ball pad. In embodiments, the through-holes are filled with the second dielectric layer to provide a contact between the first and second dielectric layers. In embodiments, the through-holes have a diameter of about 10-80 µm. In embodiments, the solder ball pad has a thickness of about 2 µm to less than 10 µm, and the diameter of the through-holes is about 10-60 µm. In embodiments, the solder ball pad has a thickness of about 10-20 µm, and the diameter of the through-holes is about 20-80 µm. In embodiments, the locking feature is completely covered by the second dielectric layer. In embodiments, the semiconductor device package further comprising a solder ball within an opening in the second dielectric layer and connected to the solder ball pad. In embodiments, the semiconductor device package comprises the solder ball pad on a multi-layer circuit interconnect situated on and electrically connected to an active area of the semiconductor die.

In another embodiment, the invention relates to a method of making a semiconductor device, which includes forming a solder ball pad on a first dielectric layer, and forming a second dielectric layer over and around at least a portion of the solder ball pad, wherein said forming the solder ball pad comprises forming a locking feature comprising one or more features configured to lock the solder ball pad to the second dielectric layer to inhibit delamination of the second dielectric layer from the solder ball pad. In embodiments, forming the locking feature comprises forming outwardly extending protrusions along a perimeter of the solder ball pad. In embodiments, the method further comprises forming the second dielectric layer to completely cover the outwardly extending protrusions. In embodiments, forming the locking feature comprises forming through-holes extending through the solder ball pad to the first dielectric layer. In embodiments, the locking features comprise a plurality of through-holes along the perimeter of the solder ball pad. In embodiments, the second dielectric layer fills the through-holes to provide a contact between the first and second dielectric layers. In embodiments, the method further includes connecting a solder ball to an exposed portion of the solder ball pad. In embodiments, the method further includes forming a multi-layer circuit interconnect on a semiconductor die, and forming the first dielectric layer over the multi-layer circuit interconnect.

The terms "top," "bottom," "over," "under," "overlying," "underlying," and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The terms "a" or "an," as used herein, are defined as one or more than one. Also, the use of introductory phrases such as "at least one," "at least two," and "one or more" in the claims should not be construed to imply that the introduction of another claim element by the indefinite articles "a" or "an" limits any particular claim containing such introduced claim element to devices, etc., containing only one such element, even when the same claim includes the introductory phrases "one or more" or "at least one" and indefinite articles such as "a" or "an." The same applies to the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required or essential feature or element of any or all of the claims.

What is claimed is:

1. A semiconductor device package, comprising:
a solder ball pad formed on a first dielectric layer, the solder ball pad having a central pad portion, a perimeter, and an edge about the perimeter, the central pad portion defining and encircling a solder ball mounting area situated inward from the edge about the perimeter, and a recessed portion within the central pad portion at an end of the solder ball pad; and
a second dielectric layer formed over the solder ball pad including the perimeter, edge and the central pad portion encircling the solder ball mounting area;
wherein
the perimeter of the solder ball pad comprises a plurality of outwardly extending protrusions extending about the perimeter up to the recessed portion, the protrusions configured to lock the solder ball pad including the edge and the central pad portion encircling the solder ball mounting area to the second dielectric layer to inhibit delamination of the second dielectric layer therefrom, including at least a first protrusion and a second protrusion adjacent to the first protrusion, the first protrusion and the second protrusion spaced apart at a distance to confine delamination of the second dielectric layer from the solder ball pad to an area between the first protrusion and the second protrusion, each of the protrusions having a first surface, a second surface and a distal end, wherein the distal ends of each of the protrusions are not interconnected to each other; and
the second dielectric layer completely covers the plurality of protrusions, the entire perimeter of the solder ball pad including the edge, and the central pad portion of the solder ball pad encircling the solder ball mounting area but not the solder ball mounting area.

2. The semiconductor device package of claim 1, wherein the plurality of protrusions each have opposing sides, a distal end, and a protrusion length, and the protrusion length is effective to limit a delamination to one side and prior to the distal end.

3. The semiconductor device package of claim 1, wherein the protrusion length is about 10-100 μm.

4. The semiconductor device package of claim 1, wherein the solder ball pad has a thickness of about 2 μm to less than 10 μm, and the protrusion length is about 10-75 μm.

5. The semiconductor device package of claim 1, wherein the solder ball pad has a thickness of about 10-20 μm, and the protrusion length is about 25-100 μm.

6. The semiconductor device package of claim 1, wherein the solder ball pad further comprises one or more through-holes situated along the perimeter and extending through the solder ball pad to the first dielectric layer, and the one or more through-holes are filled with the second dielectric layer.

7. The semiconductor device package of claim 6, wherein the through-holes have a diameter of about 10-80 μm.

8. The semiconductor device package of claim 6, wherein the solder ball pad has a thickness of about 2 μm to less than 10 μm, and the diameter of the through-holes is about 10-60 μm.

9. The semiconductor device package of claim 6, wherein the solder ball pad has a thickness of about 10-20 μm, and the diameter of the through-holes is about 20-80 μm.

10. A method of making a semiconductor device package, the method comprising:
forming a solder ball pad on a first dielectric layer, the solder ball pad having a central pad portion, a perimeter, and an edge about the perimeter, the central pad portion defining and encircling a solder ball mounting area situated inward from the edge about the perimeter, and a recessed portion within the central pad portion at an end of the solder ball pad; and
forming a second dielectric layer over the solder ball pad including the perimeter, edge and the central pad portion encircling the solder ball mounting area;
wherein
said forming the solder ball pad comprises forming a locking feature comprising one or more features configured to lock the solder ball pad including the edge and the central pad portion encircling the solder ball mounting area to the second dielectric layer to inhibit delamination of the second dielectric layer from the solder ball pad; the locking feature comprising a plurality of outwardly extending protrusions extending about the perimeter up to the recessed portion, the protrusions including at least a first protrusion and a second protrusion adjacent to the first protrusion; the first protrusion and the second protrusion spaced apart at a distance so as to confine delamination of the second dielectric layer from the solder ball pad to an area between the first protrusion and the second protrusion, each of the protrusions having a first surface, a second surface and a distal end, wherein the distal ends of each of the protrusions are not interconnected to each other; and
the second dielectric layer completely covers the plurality of protrusions, the entire perimeter of the solder ball pad including the edge, and the central pad portion of the solder ball pad encircling the solder ball mounting area but not the solder ball mounting area.

11. The method of claim 10, wherein forming the locking feature further comprises forming through-holes extending through the solder ball pad to the first dielectric layer, and forming the second dielectric layer comprises filling the through-holes with the second dielectric layer.

12. The method of claim 11, wherein the locking feature comprises a plurality of through-holes along the perimeter of the solder ball pad.

13. The method of claim 10, further comprising:
forming a multi-layer circuit interconnect on a semiconductor die; and
forming the first dielectric layer over the multi-layer circuit interconnect.

14. A semiconductor device package, comprising:
a solder ball pad formed on a first dielectric layer, the solder ball pad having a central pad portion, a perimeter, and an edge about the perimeter, the central pad portion defining and encircling a solder ball mounting area situated inward from the edge about the perimeter, and a recessed portion within the central pad portion at an end of the solder ball pad; and a second dielectric layer formed over the solder ball pad including the perimeter, edge and the central pad portion encircling the solder ball mounting area;

wherein the perimeter of the solder ball pad comprises a plurality of through-holes extending through the solder ball pad to the first dielectric layer and a plurality of outwardly extending protrusions, the protrusions extending about the perimeter up to the recessed portion and configured to lock the solder ball pad including the edge and the central pad portion encircling the solder ball mounting area to the second dielectric layer to inhibit delamination of the second dielectric layer therefrom, including at least a first protrusion and a second protrusion adjacent to the first protrusion, the first protrusion and the second protrusion spaced apart at a distance to confine delamination of the second dielectric layer from the solder ball pad to an area between the first protrusion and the second protrusion, each of the protrusions having a first surface, a second surface and a distal end, wherein the distal ends of each of the protrusions are not interconnected to each other, and the plurality of through-holes situated on the central pad portion between the edge about the perimeter and the solder ball mounting area; and the second dielectric layer completely covers the plurality of protrusions, the entire perimeter of the solder ball pad including the edge, and the central pad portion of the solder ball pad encircling the solder ball mounting area but not the solder ball mounting area, and fills the plurality of through-holes.

15. A method of making a semiconductor device package, the method comprising:

forming a solder ball pad on a first dielectric layer, the solder ball pad having a central pad portion, a perimeter, and an edge about the perimeter, the central pad portion defining and encircling a solder ball mounting area situated inward from the edge about the perimeter, and a recessed portion within the central pad portion at an end of the solder ball pad; and forming a second dielectric layer over the solder ball pad including the perimeter, edge and the central pad portion encircling the solder ball mounting area;

wherein said forming the solder ball pad comprises forming a locking feature comprising one or more features configured to lock the solder ball pad including the edge and the central pad portion encircling the solder ball mounting area to the second dielectric layer to inhibit delamination of the second dielectric layer from the solder ball pad;

the locking feature comprising a plurality of through-holes extending through the solder ball pad to the first dielectric layer and a plurality of outwardly extending protrusions, the protrusions extending about the perimeter up to the recessed portion and including at least a first protrusion and a second protrusion adjacent to the first protrusion; the first protrusion and the second protrusion spaced apart at a distance so as to confine delamination of the second dielectric layer from the solder ball pad to an area between the first protrusion and the second protrusion, each of the protrusions having a first surface, a second surface and a distal end, wherein the distal ends of each of the protrusions are not interconnected to each other protrusions; and the second dielectric layer completely covers the plurality of protrusions, the entire perimeter of the solder ball pad including the edge, and the central pad portion of the solder ball pad encircling the solder ball mounting area but not the solder ball mounting area, and fills the through-holes of the locking feature.

* * * * *